United States Patent
Li et al.

(10) Patent No.: US 11,898,773 B2
(45) Date of Patent: Feb. 13, 2024

(54) EVAPORATIVE COOLING UNIT AND DATA CENTER

(71) Applicant: Huawei Digital Power Technologies Co., Ltd., Shenzhen (CN)

(72) Inventors: Jian Li, Xi'an (CN); Biao Hu, Xi'an (CN); Zhiyao Lu, Shenzhen (CN)

(73) Assignee: HUAWEI DIGITAL POWER TECHNOLOGIES CO., LTD., Guangdong (CN)

( * ) Notice: Subject to any disclaimer, the term of this patent is extended or adjusted under 35 U.S.C. 154(b) by 92 days.

(21) Appl. No.: 17/826,826

(22) Filed: May 27, 2022

(65) Prior Publication Data

US 2022/0381454 A1    Dec. 1, 2022

(30) Foreign Application Priority Data

May 31, 2021    (CN) .......................... 202110597645.8

(51) Int. Cl.
*F24F 5/00*    (2006.01)
*F24F 13/20*    (2006.01)
(Continued)

(52) U.S. Cl.
CPC ............ *F24F 5/0035* (2013.01); *F24F 13/20* (2013.01); *F24F 13/28* (2013.01); *F24F 13/30* (2013.01);
(Continued)

(58) Field of Classification Search
CPC .......... F24F 5/0035; F24F 13/20; F24F 13/28; F24F 13/30; F24F 2110/12; F24F 7/06;
(Continued)

(56) References Cited

U.S. PATENT DOCUMENTS 5,348,077 A * 9/1994 Hillman ................... F24F 11/81
165/59
5,761,908 A * 6/1998 Oas ........................... F24H 4/06
454/238
(Continued)

FOREIGN PATENT DOCUMENTS

CN    201173536 Y    12/2008
CN    101806477 A    8/2010
(Continued)

*Primary Examiner* — Kun Kai Ma
(74) *Attorney, Agent, or Firm* — WOMBLE BOND DICKINSON (US) LLP

(57) ABSTRACT

This application provides an evaporative cooling unit. The evaporative cooling unit includes an outdoor channel, an indoor channel, and a heat exchange apparatus, and, further includes: an air filter and a defrosting apparatus that are disposed in the outdoor channel. The defrosting apparatus is located on a side that is of the air filter and that is close to an air intake vent of the outdoor channel. The defrosting apparatus includes a heat exchange film, and the heat exchange film has a first channel and a second channel that are arranged crosswise. The first channel communicates with the air intake vent of the outdoor channel, the second channel communicates with the indoor channel, and the first channel communicates with the second channel. The defrosting apparatus further includes a switch valve, and the switch valve is configured to control the second channel to communicate with the indoor channel.

20 Claims, 3 Drawing Sheets

(51) Int. Cl.
*F24F 13/28* (2006.01)
*F24F 13/30* (2006.01)
*H05K 7/20* (2006.01)
*F24F 110/12* (2018.01)

(52) U.S. Cl.
CPC ..... *H05K 7/20827* (2013.01); *H05K 7/20836* (2013.01); *F24F 2013/205* (2013.01); *F24F 2110/12* (2018.01)

(58) Field of Classification Search
CPC .......... F24F 11/41; F24F 12/006; F24F 11/42; F24F 11/65; F24F 11/72; F24F 12/001; H05K 7/20827; H05K 7/20836
See application file for complete search history.

(56) References Cited

U.S. PATENT DOCUMENTS

| | | | | |
|---|---|---|---|---|
| 6,176,305 | B1* | 1/2001 | Haglid | F28D 9/0081 |
| | | | | 165/250 |
| 6,209,622 | B1* | 4/2001 | Lagace | F24F 3/1423 |
| | | | | 165/8 |
| 7,121,110 | B2 | 10/2006 | Yum et al. | |
| 2011/0036541 | A1* | 2/2011 | Takada | F24F 12/006 |
| | | | | 165/59 |
| 2014/0260362 | A1* | 9/2014 | Jung | F28D 9/0081 |
| | | | | 165/135 |
| 2018/0245815 | A1 | 8/2018 | Lee et al. | |
| 2019/0063780 | A1* | 2/2019 | Puttagunta | F24F 11/0001 |
| 2021/0148598 | A1* | 5/2021 | Ehrman | F24F 13/20 |

FOREIGN PATENT DOCUMENTS

| | | | | |
|---|---|---|---|---|
| CN | 202719705 | U | 2/2013 | |
| CN | 206593231 | U | 10/2017 | |
| CN | 109425058 | A | 3/2019 | |
| CN | 109724190 | A | 5/2019 | |
| CN | 110006122 | A | 7/2019 | |
| CN | 110207280 | A * | 9/2019 | |
| CN | 209982958 | U | 1/2020 | |
| CN | 111380136 | A | 7/2020 | |
| CN | 111520845 | A | 8/2020 | |
| CN | 111609510 | A | 9/2020 | |
| CN | 111637539 | A | 9/2020 | |
| CN | 111664530 | A | 9/2020 | |
| CN | 112097352 | A | 12/2020 | |
| CN | 112097353 | A | 12/2020 | |
| CN | 112611034 | A | 4/2021 | |
| CN | 113465059 | A | 10/2021 | |
| FR | 3026510 | A1 * | 4/2016 | ............. F24F 11/00 |
| JP | H06213541 | A | 8/1994 | |
| JP | 2000171147 | A | 6/2000 | |
| JP | 2006336926 | A | 12/2006 | |
| JP | 2009058175 | A * | 3/2009 | ............. F24D 5/04 |
| KR | 100430278 | B1 * | 5/2004 | |
| KR | 20090129169 | A * | 12/2009 | |

* cited by examiner

EVAPORATIVE COOLING UNIT AND DATA CENTER

CROSS-REFERENCE TO RELATED APPLICATIONS

This application claims priority to Chinese Patent Application No. 202110597645.8, filed on May 31, 2021, which is hereby incorporated by reference in its entirety.

TECHNICAL FIELD

This application relates to the field of air conditioner technologies, and in particular, to an evaporative cooling unit and a data center.

BACKGROUND

An evaporative heat dissipation apparatus serves as a conventional device in the heat dissipation field. For example, in a scenario of a data center or a large building, the evaporative heat dissipation apparatus needs to be used for heat dissipation. Taking the data center as an example, an indirect evaporative cooling device is used to dissipate heat from the data center. The indirect evaporative cooling device uses an indirect evaporative cooling principle to dissipate heat, and the indirect evaporative cooling device exchanges heat of outdoor air with that of air in the data center by using a heat exchange apparatus, to cool the data center. In addition, to prevent outdoor impurities from entering the heat exchange apparatus, an air filter is disposed in the indirect evaporative cooling device to filter the outdoor air.

When the indirect evaporative cooling device is used, the indirect evaporative cooling device can obtain a cooling quantity (outdoor air) from a natural environment. However, if outdoor temperature is excessively low, especially in extreme weather states such as frosty, foggy, and snowy in autumn and winter, frost condenses or snow accumulates on the air filter. As a result, an air intake volume of the indirect evaporative cooling device decreases, and eventually an exchanged heat volume of the indirect evaporative cooling unit decreases. To resolve the foregoing problems, in the conventional technology, the outdoor air is heated based on a heating manner by using an electric heating plate, and then heated outdoor air passes through the air filter, to ensure that no frost or snow in the outdoor air condenses on the air filter, and prevent the air filter from being blocked. However, in the conventional art, the electric heating plate has the following problems: The electric heating plate is used only in winter and has no substantial use in the rest of time, causing low product utilization. If the electric heating plate is not used for a long time, a failure rate of the electric heating plate increases, and consequently reliability of the indirect evaporative cooling device is reduced. When the electric heating plate is used, melted accumulated snow soaks the electric heating plate, which is prone to cause a failure.

SUMMARY

This application provides an evaporative cooling unit and a data center, to improve a defrosting effect of the evaporative cooling unit and increase a use effect of the evaporative cooling unit.

According to a first aspect, an evaporative cooling unit is provided. The evaporative cooling unit is applied to a data center and configured to change fresh air for the data center. The evaporative cooling unit includes an outdoor channel, an indoor channel, and a heat exchange apparatus. The heat exchange apparatus is configured to exchange heat of air in the outdoor channel with that of air in the indoor channel. The data center is cooled by using the heat exchange apparatus, the outdoor channel, and the indoor channel. To prevent impurities from entering the outdoor channel, the evaporative cooling unit further includes an air filter disposed in the outdoor channel to filter the impurities. In addition, to prevent cold air in winter from forming ice on the air filter to affect an air intake effect, a defrosting apparatus is further disposed. The air filter is disposed between an air intake vent of the outdoor channel and the heat exchange apparatus, and the defrosting apparatus is located on a side that is of the air filter and that is close to the air intake vent of the outdoor channel. The defrosting apparatus includes a heat exchange film, and the heat exchange film has a first channel and a second channel that are arranged crosswise. The first channel communicates with the air intake vent of the outdoor channel, the second channel communicates with the indoor channel, and the first channel communicates with the second channel. The defrosting apparatus further includes a switch valve, and the switch valve is configured to control the second channel to communicate with the indoor channel. In the foregoing solution, when outside air temperature is relatively low, the second channel may communicate with the indoor channel by using the switch valve, and cold air entering the outdoor channel may be heated by hot air in the data center, to avoid ice forming and improve a heat exchange effect of the heat exchange apparatus. In addition, an additional heat source does not need to be provided during use of the hot air in the data center, so that energy consumption is reduced.

In one embodiment, when the switch valve controls the second channel to communicate with the indoor channel, air pressure in the first channel is lower than air pressure in the second channel. The air pressure in the second channel is lower than the air pressure in the first channel, to prevent cold air in the first channel from directly entering the indoor channel.

In one embodiment, the evaporative cooling unit further includes a first sensor and a control apparatus. The first sensor is configured to detect outdoor air temperature at the air intake vent of the outdoor channel. The control apparatus is configured to: when the first sensor detects that the outdoor air temperature is lower than a first particular value, control the switch valve to be opened, to enable the second channel to communicate with the indoor channel. The defrosting apparatus is controlled through cooperation between the first sensor and the control apparatus.

In one embodiment, the control apparatus is further configured to: when the first sensor detects that the outdoor air temperature is higher than or equal to the first particular value, control the switch valve to be closed. When the outdoor air temperature is relatively high, the switch valve is used to control the second channel to disable communication with the indoor channel.

In one embodiment, the evaporative cooling unit further includes a second sensor configured to detect temperature of outdoor air after the outdoor air flows through the defrosting apparatus. The control apparatus is further configured to: when the temperature that is of the outdoor air and that is detected by the second sensor is lower than a second particular value, control the switch valve to increase an opening amplitude, where the first particular value is lower than the second particular value. An opening degree of the switch valve is adjusted by detecting temperature of heated outdoor air.

In one embodiment, a first fan driving the outdoor air to flow indoors is disposed in the outdoor channel.

The control apparatus is further configured to control a rotation speed of the first fan, to control the air pressure in the first channel to be lower than the air pressure in the second channel, to prevent cold air in the second channel from directly entering the indoor channel.

In one embodiment, when the second channel communicates with the outdoor channel, the control apparatus is further configured to control rotation speeds of the first fan and a second fan, to control the air pressure in the second channel to be lower than the air pressure in the first channel, to ensure that hot air in the second channel can heat cold air in the first channel.

In one embodiment, the evaporative cooling unit further includes a humidifying apparatus, where the humidifying apparatus and the defrosting apparatus share the heat exchange film. The humidifying apparatus further includes a water supply apparatus, and the water supply apparatus includes a water collection tank and a water supply component. The water collection tank communicates with one end of the second channel, and is configured to collect water flowing out of the second channel. The water supply component includes a water supply pipe enabling the water collection tank to communicate with other end of the second channel, and a water pump disposed on the water supply pipe. The water pump is configured to pump water in the water collection tank into the second channel. Therefore, when outdoor temperature is relatively low, the cold air in the outdoor channel is heated by the hot air in the data center. When the outdoor temperature is relatively high, the air in the outdoor channel is humidified by using the humidifying apparatus. In the embodiment solution with the humidifying apparatus, the heat exchange film may also be referred to as a wet film.

In this embodiment solution, a defrosting function and a humidifying function are integrated into one evaporative cooling unit for implementation. The evaporative cooling unit is switched between a defrosting mode and a humidifying mode by controlling the switch valve and the water pump, to implement a dual-function evaporative cooling unit, thereby greatly increasing utilization of the evaporative cooling unit, and avoiding redundant setting in which the two functions are respectively implemented by using two apparatuses: the heating element and the wet film.

In one embodiment, the control apparatus is further configured to: when the first sensor detects that the outdoor air temperature is higher than or equal to the first particular value, control the water pump to be opened, to achieve an automatic humidifying effect.

In one embodiment, the first channel and the second channel form an included angle of 30° to 90°. For example, the included angle between the first channel and the second channel may be different angles such as 30°, 45°, 60°, and 90°.

In one embodiment, the first channel is parallel to a length direction of a part of a pipe on an air intake side of the outdoor channel, to help air enter the first channel through circulation.

In one embodiment, the heat exchange apparatus is a rhombic heat exchange apparatus, and the indoor channel and the outdoor channel are arranged in an X shape.

In one embodiment, the heat exchange apparatus is a square heat exchange apparatus, and the indoor channel and the outdoor channel are perpendicularly arranged crosswise.

According to a second aspect, a data center is provided. The data center includes an equipment room and any one of the foregoing evaporative cooling units, where the indoor channel separately communicates with the equipment room.

In the foregoing solution, when outside air temperature is relatively low, the second channel may communicate with the indoor channel by using the switch valve, and cold air entering the outdoor channel may be heated by hot air in the data center, to avoid ice forming and improve a heat exchange effect of the heat exchange apparatus. In addition, an additional heat source does not need to be provided during use of the hot air in the data center, so that energy consumption is reduced.

DESCRIPTION OF EMBODIMENTS

Figure 1:
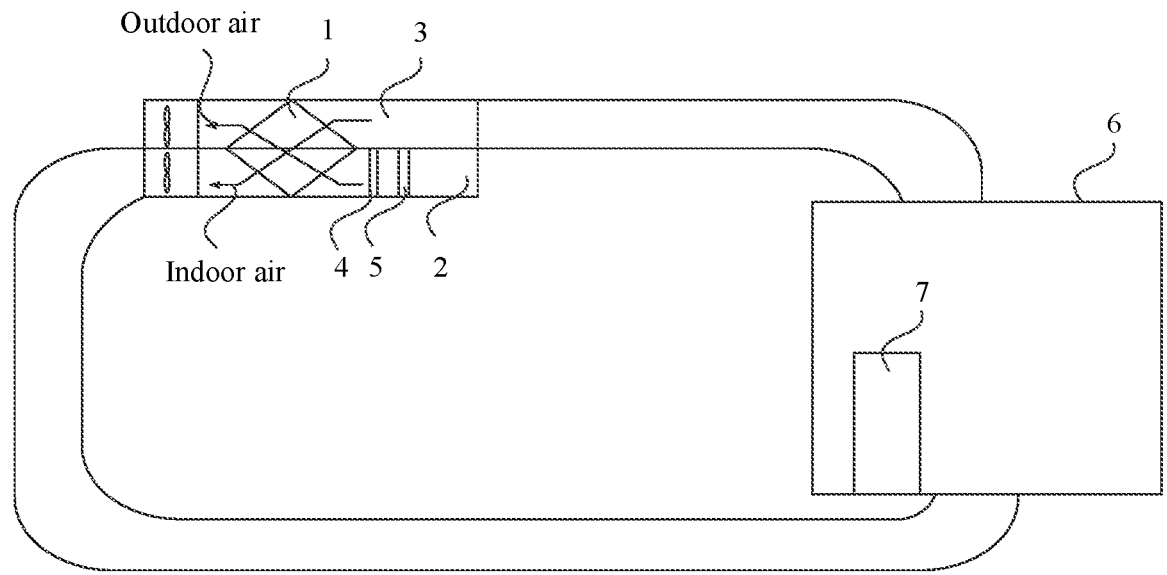
FIG. 1 is a schematic diagram of a structure of an evaporative cooling unit in the conventional technology.

To facilitate understanding of an evaporative cooling unit provided in embodiments of this application, an application scenario of the evaporative cooling unit provided in the embodiments of this application is described first. The evaporative cooling unit provided in the embodiments of this application may be applied to a data center or a building. Refer to FIG. 1. Taking the data center as an example, the evaporative cooling unit is configured to exchange heat with air in the data center. The data center includes an equipment room 6 and a cabinet 7 disposed in the equipment room 6. The evaporative unit includes a heat exchange apparatus 1, an outdoor channel 2, and an indoor channel 3. The outdoor channel 2 is configured to supply fresh air (outdoor air), and the indoor channel 3 is used for circulation of air (indoor air) in the equipment room 6. The heat exchange apparatus 1 separately communicates with the outdoor channel 2 and the indoor channel 3. When flowing through the heat exchange apparatus 1, hot air in the equipment room 6 exchanges heat with outdoor fresh air, to reduce air temperature in the equipment room 6. In addition, to prevent outdoor impurities from entering the outdoor channel 2, an air filter 4 is disposed in the outdoor channel 2. Although the foregoing evaporative cooling unit can cool air in the equipment room 6, when temperature outside the equipment room 6 is relatively low, ice is prone to be formed on the air filter 4, which blocks a mesh of the air filter 4 and affects an air intake volume. To resolve an icing up problem on the air filter 4, a heating apparatus 5 is added to an air intake end of the air filter 4, to heat outdoor air. However, the heating apparatus 5 increases energy consumption of the evaporative cooling unit in one aspect, and increases costs of the evaporative cooling unit in another aspect. In addition, the heating apparatus 5 is used only when it is cold outside and may be idle when outdoor temperature is relatively high, and therefore has relatively low overall utilization. Therefore, this application provides an evaporative cooling unit for deicing the air filter 4 by using high indoor temperature. The evaporative cooling unit is described below with reference to accompanying drawings and embodiments.

Figure 2:
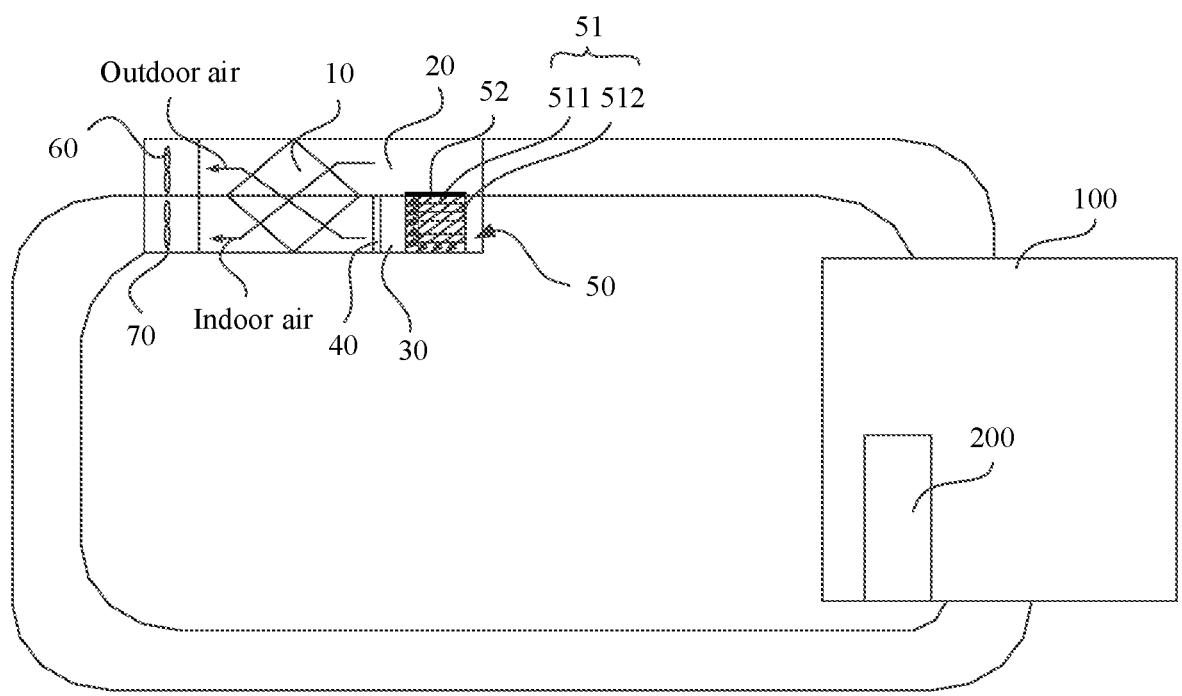
FIG. 2 is a schematic diagram of a structure of an evaporative cooling unit according to an embodiment of this application.

FIG. 2 is a schematic diagram of a structure of an evaporative cooling unit according to an embodiment of this application. The evaporative cooling unit includes a heat exchange apparatus 10, an outdoor channel 30, and an indoor channel 20. The heat exchange apparatus 10 is a rhombic heat exchange apparatus, and the indoor channel 20 and the outdoor channel 30 are arranged in an X shape. The heat exchange apparatus 10 is located at a location at which the outdoor channel 30 and the indoor channel 20 cross each other, and the heat exchange apparatus 10 separately communicates with the indoor channel 20 and the outdoor channel 30.

The outdoor channel 30 is configured to provide outdoor fresh air (outdoor air), the indoor channel 20 is configured to provide a channel for circulation and flowing of air (indoor air) in the equipment room 100, and the heat exchange apparatus 10 is configured to exchange heat of air in the outdoor channel 30 with that of air in the indoor channel 20. As shown in FIG. 2, the indoor channel 20 communicates with the equipment room 100. Heat generated by a cabinet 200 causes relatively high temperature of the air in the equipment room. The indoor air with relatively high temperature flows into the heat exchange apparatus 10 through the indoor channel 20 to exchange heat with the outdoor air in the outdoor channel 30, to cool the indoor air to lower working ambient temperature of the cabinet 200.

To improve an air flowing effect, a first fan 60 and a second fan 70 are further disposed in the evaporative cooling unit. The first fan 60 is disposed in the outdoor channel 30 and configured to drive outdoor air to flow in the outdoor channel 30. The second fan 70 is disposed in the indoor channel 20 and configured to drive indoor air to flow. When the evaporative cooling unit works, the first fan 60 and the second fan 70 rotate simultaneously, and are configured to drive the indoor air and the outdoor air to flow, to improve a heat exchange effect.

It should be understood that in FIG. 2, the example disposing locations of the first fan 60 and the second fan 70 is merely an example solution. When the first fan 60 and the second fan 70 are particularly disposed, the disposing locations may be determined based on an actual requirement, and is not limited to the locations shown in FIG. 2.

Still refer to FIG. 2. To prevent external impurities from entering the outdoor channel 30, an air filter 40 is disposed in the outdoor channel 30. The air filter 40 is located at an air intake vent of the outdoor channel 30 (between the air intake vent of the outdoor channel 30 and the heat exchange apparatus 10), to prevent impurities in outdoor air from entering the outdoor channel 30. To prevent ice from being formed on the air filter 40 due to overcooling outdoor air, a defrosting apparatus 50 is further disposed in the evaporative cooling unit provided in this embodiment of this application. The defrosting apparatus 50 is located in the outdoor channel 30, and the defrosting apparatus 50 is located on a side that is of the air filter 40 and that is close to the air intake vent of the outdoor channel 30 (between the air intake vent of the outdoor channel 30 and the air filter 40). When flowing into the outdoor channel 30, outside air first flows through the defrosting apparatus 50, and then flows through the air filter 40. A structure and a working principle of the defrosting apparatus 50 are described below in detail with reference to accompanying drawings.

Figure 3:
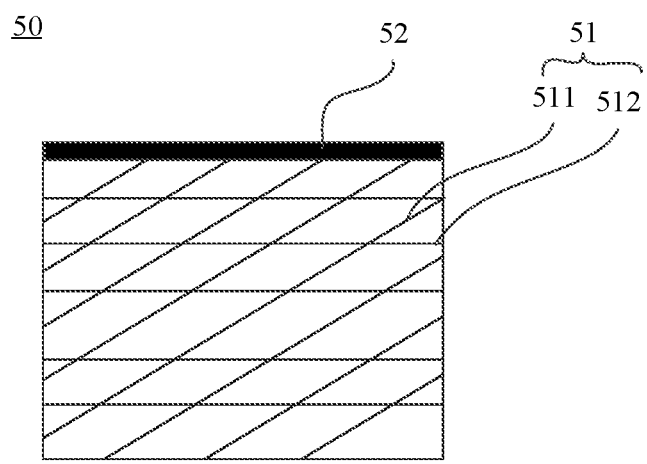
FIG. 3 is a schematic diagram of a structure of a defrosting apparatus according to an embodiment of this application.

Refer to FIG. 2 and FIG. 3 together. FIG. 3 is a schematic diagram of a structure of a defrosting apparatus 50 according to an embodiment of this application. The defrosting apparatus 50 includes a heat exchange film 51. The heat exchange film 51 serves as a main structure of the defrosting apparatus 50, and has a shape in a long bar structure, such as a shape of a cuboid or a cylinder. The heat exchange film 51 is located in the outdoor channel 30, and a cross-section of the heat exchange film 51 matches a cross-section of the outdoor channel 30. For example, the cross-section of the heat exchange film 51 may have different shapes such as a rectangular shape and a circular shape. This is not limited in this application. In addition, the heat exchange film 51 may have a particular length along a length direction of the outdoor channel 30, so that outdoor air can flow in the heat exchange film 51 for a particular distance.

The heat exchange film 51 has a first channel 512 and a second channel 511 that are arranged crosswise, and the first channel 512 and the second channel 511 that are arranged crosswise communicate with each other. For example, the second channel 511 and the first channel 512 form a particular angle, for example, an included angle between the first channel 512 and the second channel 511 is an included angle of 30° to 90°. For example, the included angle between the first channel 512 and the second channel 511 may be different angles such as 30°, 45°, 60°, and 90°, as long as the second channel 511 intersects with the first channel 512.

When the first channel 512 and the second channel 511 are disposed, there are both a plurality of first channels 512 and a plurality of second channels 511, and the plurality of first channels 512 and the plurality of second channels 511 form a crossed grid-shape pipe structure.

The first channel 512 is configured to communicate with the air intake vent of the outdoor channel 30, and outdoor air flowing through the outdoor channel 30 flows through the first channel 512 and then enters the heat exchange apparatus 10. For example, one end of the first channel 512 communicates with the air intake vent of the outdoor channel 30, and the other end communicates with an inner side of the outdoor channel 30. To help outdoor air pass through the heat exchange film 51, a length direction of the first channel 512 follows a flowing direction of the outdoor air, to reduce resistance when outside air flows through the first channel 512. A straight-line arrow shown in FIG. 2 denotes outdoor air flowing through the first channel 512, and the first channel 512 is parallel to a length direction of a part of a pipe on an air intake side of the outdoor channel 30, to reduce resistance caused to the outdoor air.

When there are a plurality of first channels 512, the plurality of first channels 512 are arranged along a surface that is on the heat exchange film 51 and that is perpendicular to a flowing direction of the outside air, so that more outdoor air can simultaneously pass through the heat exchange film 51. An arrangement manner of the first channels 512 may be a regular array arrangement manner, or may be an irregular arrangement manner. This is not limited in this embodiment of this application.

The second channel 511 communicates with the indoor channel 20, and the indoor air in the indoor channel 20 may flow through the second channel. For example, openings at two ends of the second channel 511 are respectively located on a top surface and a bottom surface of the heat exchange film 51 (a placement direction of the heat exchange film shown in FIG. 2 is used as a reference direction). The top surface of the heat exchange film 51 refers to a surface that is of the heat exchange film 51 and that is close to the indoor channel 20, and the bottom surface of the heat exchange film 51 refers to a surface that is of the heat exchange film 51 and that deviates from the indoor channel 20 when the heat exchange film 51 is fixed in the outdoor channel 30.

It should be understood that the heat exchange film 51 provided in this embodiment of this application may be in different structures, such as a wet film, a membrane material structure with a capillary structure, or a membrane material structure with a capillary channel.

A switch valve 52 is further disposed in the defrosting apparatus 50. The switch valve 52 is configured to control the second channel 511 to communicate with the indoor channel 20, and a location at which the second channel 511 communicates with the indoor channel 20 is at a location before the indoor channel 20 is connected to the heat exchange apparatus 10. For example, a through hole is disposed on a sidewall of the indoor channel 20, and the switch valve 52 is disposed in the through hole and configured to control communication between the second channel 511 and the indoor channel 20.

When the switch valve 52 is opened, the second channel 511 communicates with the indoor channel 20, and when the second channel 511 is closed, communication between the second channel 511 and the indoor channel 20 is disabled.

When the air filter 40 needs to be defrosted, the switch valve 52 is opened, and the second channel 511 communicates with the indoor channel 20. Because temperature in the indoor channel 20 is relatively high and temperature in the outdoor channel 30 is relatively low, the indoor channel 20 may be considered as a high pressure area, the outdoor channel 30 may be considered as a low pressure area, and hot air in the indoor channel 20 may flow into the second channel 511. When outdoor air flows through the first channel 512, cold air in the first channel 512 may be heated by hot air in the second channel 511, to increase temperature of the cold air, and moisture carried in the cold air may be carried out of the heat exchange film 51 through the air in the second channel 511. Therefore, when the outdoor air flowing through the first channel 512 flows through the air filter 40, frost is not formed on the air filter 40, to prevent the air filter 40 from being blocked, and improve air flowing efficiency. In this state, the defrosting apparatus 50, as a preheating apparatus, heats outdoor air by using the indoor hot air, to reduce a probability of forming frost.

It can be learned from the foregoing description that when outside air temperature is relatively low, the second channel 511 may communicate with the indoor channel 20 by using the switch valve 52, and cold air entering the outdoor channel 30 may be heated by hot air in the data center, to avoid ice forming and improve a heat exchange effect of the heat exchange apparatus 10. In addition, an additional heat source does not need to be provided during use of the hot air in the data center, so that energy consumption is reduced.

Figure 4:
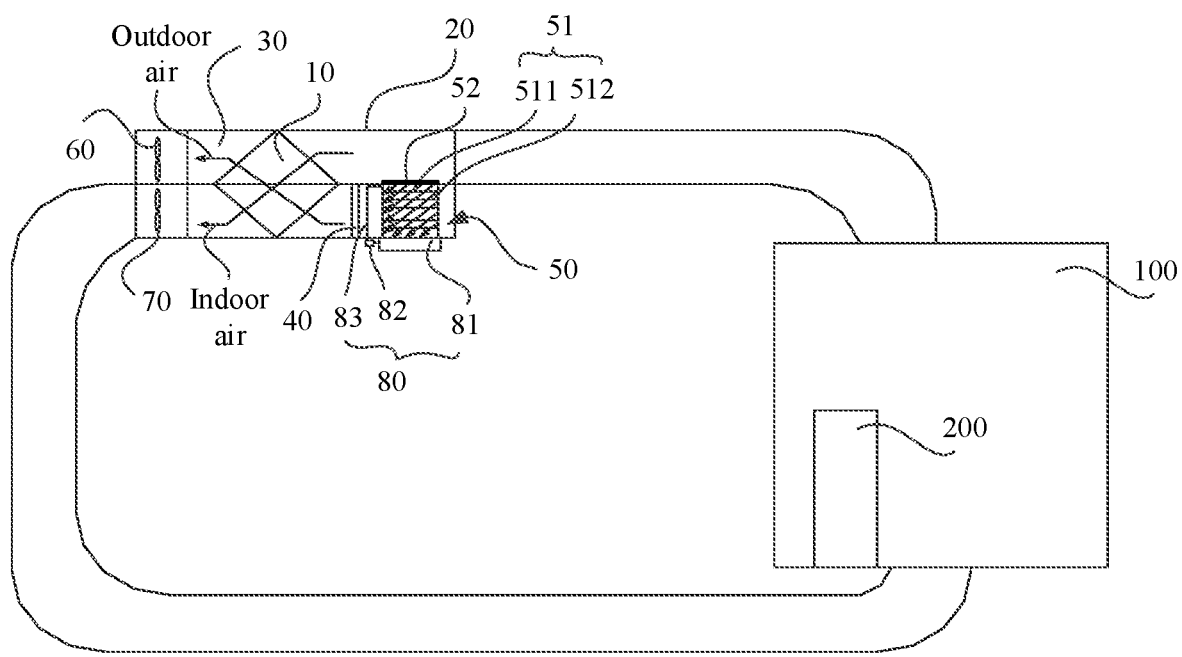
FIG. 4 is a schematic diagram of a structure of an evaporative cooling unit according to an embodiment of this application.

FIG. 4 shows another evaporative cooling unit modified based on the evaporative cooling unit shown in FIG. 2. For reference numerals in FIG. 4, refer to the same reference numerals in FIG. 2.

The heat exchange film 51 of the defrosting apparatus 50 uses a wet film, and in this case, the evaporative cooling unit may integrate a humidifying apparatus, so that outdoor air may be humidified by using the humidifying apparatus, to humidify the outdoor air. The humidifying apparatus and the defrosting apparatus 50 share the heat exchange film 51. In addition to including the heat exchange film 51, the humidifying apparatus also includes a water supply apparatus 80. The water supply apparatus 80 is configured to supply water to the heat exchange film 51, to humidify air flowing through the first channel 512. In one embodiment, the water supply apparatus 80 communicates with the second channel 511. When water circulates in the second channel 511, because the first channel 512 communicates with the second channel 511, outdoor air flowing through the first channel 512 may be humidified by the water in the second channel 511.

The water supply apparatus 80 may include a water collection tank 81 and a water supply component. The water collection tank 81 contains water circulating in the second channel 511. The water supply component includes a water supply pipe 83 enabling the water collection tank 81 to communicate with the second channel 511. One end of the water supply pipe 83 communicates with the water collection tank 81, and the other end communicates with the top of the second channel 511. A water pump 82 configured to drive water to circulate is disposed on the water supply pipe 83. During working, the water pump 82 draws the water in the water collection tank 81 into the second channel 511, and the water flows in the second channel 511 under gravity and humidifies air flowing through the first channel 512.

The water collection tank 81 is further configured to collect water flowing out of the second channel 511. As shown in FIG. 4, the water collection tank 81 is located below the heat exchange film 51, and the water flowing out of the second channel 511 may directly fall into the water collection tank 81, to achieve cyclic utilization of the water.

It can be learned from the foregoing description that the evaporative cooling unit shown in FIG. 4 may include two different working states, where one working state is a humidifying state and the other working state is a defrosting state. When outdoor temperature is relatively high, the outdoor air may be humidified by using the humidifying apparatus. When the outdoor temperature is relatively low, the outdoor air may be heated by using the defrosting apparatus 50, to prevent frost from being formed on the air filter 40. The two working states are described below one by one.

The humidified state is described first. In this state, the switch valve 52 is closed, communication between the second channel 511 and the indoor channel 20 is disabled, and the water supply component starts to work. The water supply component continuously supplies water to the second channel 511, and the water collection tank 81, the water supply pipe 83, and the second channel 511 form a water circulation channel. When air flows through the first channel 512, the air may be humidified by the water in the second channel 511, to avoid that air enter indoors is relatively dry, and improve a fresh air supply effect.

Then, the defrosting state is described. In this state, the switch valve 52 is opened, the second channel 511 communicates with the indoor channel 20, and the water supply component stops working. Because temperature in the indoor channel 20 is relatively high and temperature in the outdoor channel 30 is relatively low, the indoor channel 20 may be considered as a high pressure area, the outdoor channel 30 may be considered as a low pressure area, and hot air in the indoor channel 20 may flow into the second channel 511. When the outdoor air flows through the first channel 512, cold air in the first channel 512 may be heated by the hot air in the second channel 511, to increase temperature of the cold air, and moisture carried in the cold air may be carried out of the heat exchange film 51 through the air in the second channel 511 and collected in the water collection tank 81. When the outdoor air flowing through the first channel 512 flows through the air filter 40, frost is not formed on the air filter 40, to prevent the air filter 40 from being blocked, and improve air flowing efficiency. In this state, the defrosting apparatus 50, as a preheating apparatus, heats outdoor air by using the indoor hot air, to reduce a probability of forming frost.

In one embodiment, a water filling port and a water draining port may be disposed on the water collection tank 81, so that after the water collection tank 81 collects more snow water, the snow water is drained out, and when there is less water in the water collection tank 81, a water amount is increased.

It can be learned from the foregoing description that the evaporative cooling unit can select different working modes based on an outdoor environment to process outdoor air. When outdoor temperature is relatively high, the outdoor air can be humidified, and when the outdoor temperature is relatively low, the outdoor air can be heated to avoid frost forming. The foregoing evaporative cooling unit integrates a defrosting function and a humidifying function into one evaporative cooling unit. The evaporative cooling unit is switched between the defrosting mode and the humidifying mode by controlling the switch valve 52 and the water pump 82, to implement a dual-function evaporative cooling unit, thereby greatly increasing utilization of the evaporative cooling unit, and avoiding redundant setting in which the two functions are respectively implemented by using two apparatuses: the heating element and the wet film.

With reference to FIG. 2 and FIG. 4, when the defrosting apparatus 50 works, indoor air needs to flow into the heat exchange film 51 along the second channel 511. Because the first channel 512 communicates with the second channel 511, when the second channel 511 communicates with the indoor channel 20, the first channel 512 also communicates with the indoor channel 20. To prevent air in the first channel 512 from flowing into the indoor channel 20 through the second channel 511, when the switch valve 52 controls the second channel 511 to communicate with the indoor channel 20, air pressure in the first channel 512 is lower than air pressure in the second channel 511, so that the first channel 512 forms a zone of negative pressure relative to the second channel 511. An effect that indoor hot air flows into the second channel 511 is enhanced by using a feature that air flows into a low pressure area along a high pressure area, and cold air in the first channel 512 is also prevented from directly entering the indoor channel 20.

In one embodiment, when the second channel 511 communicates with the outdoor channel 30, rotation speeds of the first fan 60 and the second fan 70 may be controlled to control the air pressure in the second channel 511 to be lower than the air pressure in the first channel 512. For example, when the second channel 511 communicates with the indoor channel 20, the rotation speed of the first fan 60 is controlled to be relatively high, to increase a flowing speed of air in the air intake channel 30, and further increase a flowing speed of air in the first channel 512, so that a low pressure area with relatively low air pressure is formed when the cold air flows at a relatively high speed. In addition, the second fan 70 is controlled to work at a relatively low rotation speed, and the indoor channel 20 forms a high pressure area with relatively high air pressure, to ensure that indoor hot air can flow into the second channel 511, and that cold air in the first channel 512 can be heated by the hot air in the second channel 511. It should be understood that in addition to changing the air pressure in the first channel 512 and that in the second channel 511 in the heat exchange film 51 through the foregoing cooperation between the first fan 60 and the second fan 70, the air pressure in the first channel 512 also can be lower than the air pressure in the second channel 511 by accelerating only the rotation speed of the first fan 60.

The evaporative cooling unit can switch between two working modes in different control manners. One manner may be a manual switching. In one embodiment, an employee manually controls, based on outdoor air temperature, the switch valve 52 and the water pump 82 to be opened and closed. In this case, the switch valve 52 may be a common manual switch valve. The other manner is an automatic control manner. In the automatic control manner, a sensor is disposed to detect outdoor air temperature, and the control apparatus is used to control, based on the outdoor air temperature detected by the sensor, the switch valve 52 to be opened or closed, and controls, based on the outdoor air temperature detected by the sensor, the water pump 82 to be opened or closed. Automatically controlling the defrosting apparatus 50 to switch a working status is described below in detail.

Figure 5:
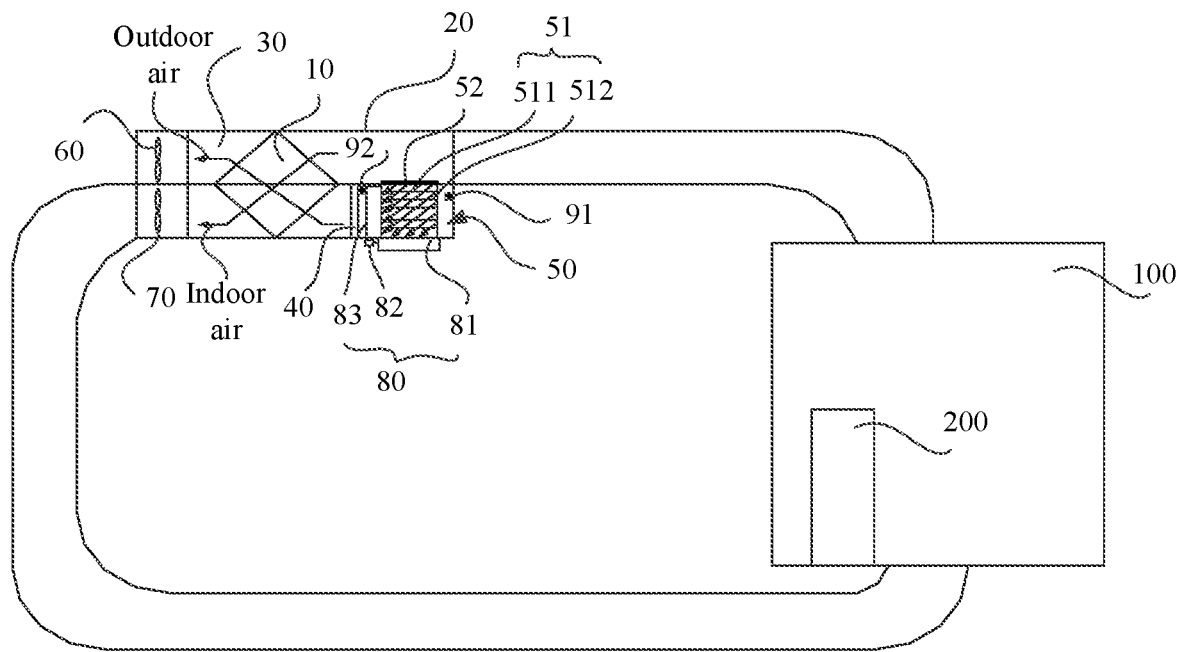
FIG. 5 is a schematic diagram of a structure of an evaporative cooling unit according to an embodiment of this application.

FIG. 5 shows a deformed structure based on the evaporative cooling unit shown in FIG. 4. In addition to the structure shown in FIG. 4, the evaporative cooling unit also includes a first sensor 91 and a control apparatus (not shown in the figure). The first sensor 91 is configured to detect outdoor air temperature at the air intake vent of the outdoor channel 30. The first sensor 91 may be a temperature sensor, including but not limited to a common temperature sensor in the conventional technology, such as a thermocouple sensor, a thermistor sensor, a resistance temperature detector, and an IC temperature sensor. The first sensor 91 is disposed at the air intake vent of the outdoor channel 30 to detect temperature of outdoor air entering the outdoor channel 30. However, it should be understood that a disposing location of the first sensor 91 is not only limited to a location shown in FIG. 4, and the first sensor 91 may alternatively be disposed in an equipment room or at another location, as long as the first sensor 91 can detect air temperature outside the equipment room.

The control apparatus is configured to determine, based on the outdoor air temperature detected by the sensor, whether to open the switch valve 52. For example, the control apparatus is connected to the first sensor 91 and the switch valve 52 through a signal, and is configured to: when the first sensor 91 detects that the outdoor air temperature is lower than a first particular value, control the switch valve 52 to be opened. After the switch valve 52 is opened, the second channel 511 communicates with the indoor channel 20, and indoor hot air may heat cold air in the outdoor channel 30 by using the heat exchange film 51, to avoid frost forming. The foregoing control apparatus may be a common control apparatus such as an existing PLC (Programmable Logic Controller) and an industrial computer, and the switch valve 52 may be a solenoid valve or another electrically controllable valve. It is a common control manner in which the control apparatus controls, based on a detection signal of the first sensor 91, the switch valve 52 to work. Details are not described herein.

The first particular temperature may be a value ranging from 0° C. to 10° C. For example, when the outdoor temperature is lower than 0° C., the control apparatus determines that frost is formed. Therefore, the control apparatus controls the switch valve 52 to be opened, so that the indoor hot air can heat the outdoor cold air in the outdoor channel 30.

In addition, when the outdoor air temperature is relatively high, there is no risk of forming frost. In this case, the control apparatus may be further configured to: when the first sensor 91 detects that the outdoor air temperature is higher than or equal to the first particular value, control the switch valve 52 to be closed, and control the water supply apparatus 80 to supply water to the second channel 511. In this case, the control apparatus switches to the humidifying state to work.

It can be learned from the foregoing description that the defrosting apparatus 50 can be automatically switched between two different working states through cooperation between the first sensor 91 and the control apparatus, to avoid a manual operation, improve a speed of making a response to the outdoor air temperature by the evaporative cooling unit, and reduce a risk of forming frost.

In the defrosting state, defrosting may be incomplete. To improve a defrosting effect, the evaporative cooling unit further includes a second sensor 92. The second sensor 92 is configured to detect temperature of outdoor air after the outdoor air flows through the defrosting apparatus 50. For example, the second sensor 92 is disposed between the air filter 40 and the heat exchange film 51, or is disposed between the air filter 40 and the heat exchange apparatus 10. When outdoor air heated by indoor air flows through the second sensor 92, the second sensor 92 may detect temperature of the outdoor air. When the outdoor air temperature detected by the second sensor 92 is lower than a second particular value, the control apparatus may control the switch valve 52 to increase an opening amplitude. The first particular value is lower than the second particular value. For example, the second particular value may be a temperature value ranging from 5° C. to 15° C. When the second sensor 92 detects that temperature of air after the air flows through the heat exchange film 51 is less than the second particular value, the control apparatus determines that there is a risk of an incomplete defrosting effect, and controls the switch valve 52 to increase the opening amplitude, so that more indoor air flows into the second channel 511, to improve an effect of heating the cold air in the first channel 512. When the air temperature detected by the second sensor 92 is greater than or equal to the second particular value, the switch valve 52 may maintain a current opening amplitude.

When the control apparatus controls the opening amplitude of the switch valve 52, the control apparatus may control, by using a difference between the temperature detected by the first sensor 91 and the temperature detected by the second sensor 92, a size by which the opening amplitude of the switch valve 52 is increased. For example, the temperature detected by the first sensor 91 is T0, and the temperature detected by the second sensor 92 is T1. When the difference between T1 and T0 is larger, the control apparatus controls the switch valve 52 to be opened at a smaller amplitude, and when the difference between T1 and T0 is smaller, the control apparatus controls the switch valve 52 to be opened at a larger amplitude.

It can be learned from the foregoing cooperation between the first sensor 91, the second sensor 92, and the control apparatus that an effect of controlling defrosting can be further improved.

In addition, the control apparatus is further configured to: when the first sensor 91 detects that the outdoor air temperature is higher than or equal to the first particular value, control the water pump 82 to be opened. In this state, the control apparatus controls the switch valve 52 to be closed, so that communication between the second channel 511 and the indoor channel 20 is disabled, and the control apparatus controls the water pump 82 to start working. The water supply component continuously supplies water to the second channel 511, and the water collection tank 81, the water supply pipe 83, and the second channel 511 form a water circulation channel. When air flows through the first channel 512, the air may be humidified by the water in the second channel 511, to achieve an automatic humidifying effect.

Figure 6:
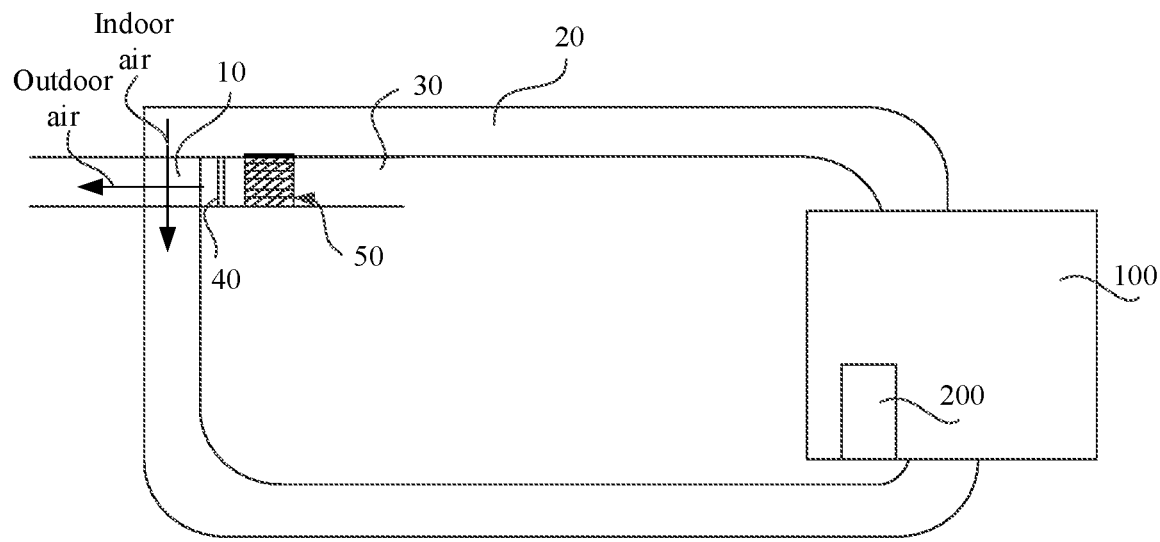
FIG. 6 is a schematic diagram of a structure of an evaporative cooling unit according to an embodiment of this application.

FIG. 6 is a schematic diagram of a structure of another evaporative cooling unit according to an embodiment of this application. A difference from the evaporative cooling unit shown in FIG. 5 only lies in a change of a shape of the heat exchange apparatus 10, and the heat exchange apparatus 10 shown in FIG. 6 is a square heat exchange apparatus. To adapt to the shape of the heat exchange apparatus 10, the indoor channel 20 and the outdoor channel 30 cross perpendicularly. As shown in FIG. 6, the outdoor channel 30 is a horizontal straight channel, the indoor channel 20 is a U-shaped ventilation channel, and the indoor channel 20 communicates with the equipment room 100. Air in the outdoor channel 30 may exchange heat with air in the indoor channel 20, to cool air in the equipment room 100. It should be understood that both the defrosting apparatus and the humidifying apparatus shown in FIG. 2 to FIG. 5 may be applied to the evaporative cooling unit shown in FIG. 6, and details are not described herein again.

An embodiment of this application further provides a data center. The data center includes an equipment room and any one of the foregoing evaporative cooling units. The indoor channel 20 communicates with the equipment room. In the foregoing solution, when outside air temperature is relatively low, the second channel may communicate with the indoor channel by using the switch valve, and cold air entering the outdoor channel may be heated by hot air in the data center, to avoid ice forming and improve a heat exchange effect of the heat exchange apparatus. In addition, an additional heat source does not need to be provided during use of the hot air in the data center, so that energy consumption is reduced. In addition, when humidification is required, air in the outdoor channel may be humidified by using the humidifying apparatus, to reuse and switch between defrosting and humidifying functions, and ensure humidity in the equipment room of the data center.

It is clear that a person skilled in the art can make various modifications and variations to this application without departing from the spirit and scope of this application. This application is intended to cover these modifications and variations of this application provided that they fall within the scope of protection defined by the following claims and their equivalent technologies.

What is claimed is:

1. An evaporative cooling unit comprising:
  an outdoor channel;
  an indoor channel;
  a heat exchange apparatus, wherein the heat exchange apparatus is configured to exchange heat of air in the outdoor channel with that of air in the indoor channel; and
  an air filter and a defrosting apparatus that are disposed in the outdoor channel, wherein the air filter is located between an air intake vent of the outdoor channel and the heat exchange apparatus, and the defrosting apparatus is located on a side that is of the air filter and that is close to the air intake vent of the outdoor channel, and, the defrosting apparatus comprises a heat exchange film, and the heat exchange film includes a first channel and a second channel that are arranged crosswise, wherein the first channel communicates with the air intake vent of the outdoor channel, the second channel communicates with the indoor channel, and the first channel communicates with the second channel, and, the defrosting apparatus further comprises a switch valve, wherein the switch valve is configured to control the second channel to communicate with the indoor channel.

2. The evaporative cooling unit according to claim 1, wherein, when the switch valve controls the second channel to communicate with the indoor channel, air pressure in the first channel is lower than air pressure in the second channel.

3. The evaporative cooling unit according to claim 1, wherein, the evaporative cooling unit further comprises a first sensor and a control apparatus, the first sensor is configured to detect outdoor air temperature at the air intake vent of the outdoor channel, and the control apparatus is configured to: when the first sensor detects that the outdoor air temperature is lower than a first value, control the switch valve to be opened, to enable the second channel to communicate with the indoor channel.

4. The evaporative cooling unit according to claim 2, wherein, the evaporative cooling unit further comprises a first sensor and a control apparatus, the first sensor is configured to detect outdoor air temperature at the air intake vent of the outdoor channel, and the control apparatus is configured to: when the first sensor detects that the outdoor air temperature is lower than a first value, control the switch valve to be opened, to enable the second channel to communicate with the indoor channel.

5. The evaporative cooling unit according to claim 3, wherein, the control apparatus is further configured to: when the first sensor detects that the outdoor air temperature is higher than or equal to the first value, control the switch valve to be closed.

6. The evaporative cooling unit according to claim 3, wherein, the evaporative cooling unit further comprises a second sensor configured to detect temperature of outdoor air after the outdoor air flows through the defrosting apparatus; and
the control apparatus is further configured to: when the temperature that is of the outdoor air and that is detected by the second sensor is lower than a second value, control the switch valve to increase an opening amplitude, wherein the first value is lower than the second value.

7. The evaporative cooling unit according to claim 5, wherein, the evaporative cooling unit further comprises a second sensor configured to detect temperature of outdoor air after the outdoor air flows through the defrosting apparatus; and
the control apparatus is further configured to: when the temperature that is of the outdoor air and that is detected by the second sensor is lower than a second value, control the switch valve to increase an opening amplitude, wherein the first value is lower than the second value.

8. The evaporative cooling unit according to claim 2, wherein, a first fan driving the outdoor air to flow indoors is disposed in the outdoor channel; and
the control apparatus is further configured to control a rotation speed of the first fan, to control the air pressure in the first channel to be lower than the air pressure in the second channel.

9. The evaporative cooling unit according to claim 5, further comprising:

a humidifying apparatus, wherein the humidifying apparatus and the defrosting apparatus share the heat exchange film;
wherein, the humidifying apparatus further comprises a water supply apparatus, wherein the water supply apparatus comprises a water collection tank and a water supply component;
the water collection tank communicates with one end of the second channel, and is configured to collect water flowing out of the second channel; and
the water supply component comprises a water supply pipe enabling the water collection tank to communicate with the other end of the second channel, and a water pump disposed on the water supply pipe, wherein the water pump is configured to pump water in the water collection tank into the second channel.

10. The evaporative cooling unit according to claim 8, further comprising:
a humidifying apparatus, wherein the humidifying apparatus and the defrosting apparatus share the heat exchange film;
wherein, the humidifying apparatus further comprises a water supply apparatus, wherein the water supply apparatus comprises a water collection tank and a water supply component;
the water collection tank communicates with one end of the second channel, and is configured to collect water flowing out of the second channel; and
the water supply component comprises a water supply pipe enabling the water collection tank to communicate with the other end of the second channel, and a water pump disposed on the water supply pipe, wherein the water pump is configured to pump water in the water collection tank into the second channel.

11. The evaporative cooling unit according to claim 9, wherein the control apparatus is further configured to: when the first sensor detects that the outdoor air temperature is higher than or equal to the first value, control the water pump to be opened.

12. The evaporative cooling unit according to claim 1, wherein the first channel and the second channel form an included angle of 30° to 90°.

13. The evaporative cooling unit according to claim 2, wherein, the first channel and the second channel form an included angle of 30° to 90°.

14. The evaporative cooling unit according to claim 1, wherein, the first channel is parallel to a length direction of a part of a pipe on an air intake side of the outdoor channel.

15. The evaporative cooling unit according to claim 2, wherein, the first channel is parallel to a length direction of a part of a pipe on an air intake side of the outdoor channel.

16. The evaporative cooling unit according to claim 1, wherein, the heat exchange apparatus is a rhombic heat exchange apparatus, and the indoor channel and the outdoor channel are arranged in an X shape.

17. The evaporative cooling unit according to claim 2, wherein, the heat exchange apparatus is a rhombic heat exchange apparatus, and the indoor channel and the outdoor channel are arranged in an X shape.

18. The evaporative cooling unit according to claim 1, wherein, the heat exchange apparatus is a square heat exchange apparatus, and the indoor channel and the outdoor channel are perpendicularly arranged crosswise.

19. The evaporative cooling unit according to claim 2, wherein, the heat exchange apparatus is a square heat exchange apparatus, and the indoor channel and the outdoor channel are perpendicularly arranged crosswise.

20. A data center comprising:
an equipment room; and
an evaporative cooling unit; wherein the evaporative cooling unit comprise an outdoor channel, an indoor channel, and a heat exchange apparatus, wherein the heat exchange apparatus is configured to exchange heat of air in the outdoor channel with that of air in the indoor channel, the evaporative cooling unit further comprises an air filter and a defrosting apparatus that are disposed in the outdoor channel, wherein the air filter is located between an air intake vent of the outdoor channel and the heat exchange apparatus, and the defrosting apparatus is located on a side that is of the air filter and that is close to the air intake vent of the outdoor channel;
wherein, the defrosting apparatus comprises a heat exchange film, and the heat exchange film has a first channel and a second channel that are arranged crosswise, wherein the first channel communicates with the air intake vent of the outdoor channel, the second channel communicates with the indoor channel, and the first channel communicates with the second channel, and, the defrosting apparatus further comprises a switch valve, wherein the switch valve is configured to control the second channel to communicate with the indoor channel; and
wherein the indoor channel separately communicates with the equipment room.

\* \* \* \* \*